United States Patent
Sakamoto et al.

(10) Patent No.: US 6,797,092 B2
(45) Date of Patent: Sep. 28, 2004

(54) METHOD AND APPARATUS FOR MANUFACTURING MONOLITHIC CERAMIC ELECTRONIC COMPONENT

(75) Inventors: Yoshinori Sakamoto, State College, PA (US); Kengo Shimizu, Fukui-ken (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 275 days.

(21) Appl. No.: 10/132,194

(22) Filed: Apr. 26, 2002

(65) Prior Publication Data

US 2002/0157225 A1 Oct. 31, 2002

(30) Foreign Application Priority Data

Apr. 26, 2001 (JP) ........................................ 2001-130007
Feb. 14, 2002 (JP) ........................................ 2002-037229

(51) Int. Cl.[7] ............................ B32B 31/26; H05K 3/46; H01G 13/00
(52) U.S. Cl. ................... 156/89.12; 156/89.16; 156/263; 156/264; 156/512; 156/517
(58) Field of Search ........................... 156/89.12, 89.16, 156/263, 264, 512, 517

(56) References Cited

U.S. PATENT DOCUMENTS 5,224,250 A * 7/1993 Hamuro et al. ............ 29/25.42
5,922,168 A * 7/1999 Zablotny et al. ............ 156/379
5,942,063 A * 8/1999 Mori ........................ 156/89.16
6,370,748 B1 * 4/2002 Baccini ..................... 29/33 M
6,514,372 B1 * 2/2003 Yamazaki .................... 156/256
6,663,740 B2 * 12/2003 Yamasaki ................... 156/248

FOREIGN PATENT DOCUMENTS

| JP | 4-2196 | 1/1992 |
|---|---|---|
| JP | 6-246730 | 9/1994 |

* cited by examiner

*Primary Examiner*—Melvin C. Mayes
(74) *Attorney, Agent, or Firm*—Burns, Doane, Swecker & Mathis, L.L.P.

(57) ABSTRACT

A method for manufacturing a monolithic ceramic electronic component formed by using a laminate allows a plurality of types of ceramic green sheets to be laminated with ease and efficiency. The method enables a reduction in space for lamination. This method includes first, a ceramic green sheet with a predetermined shape is cut out of a long first ceramic green sheet supported on a carrier film by a cutting/ laminating head. The cut-out ceramic green sheet is laminated to the cutting/laminating head. A card-like second ceramic green sheet supported on a carrier film is cut by a cutting/laminating head. The cut ceramic green sheets is laminated to the cutting/laminating head. A laminate is formed by performing each of the first and second steps plural times.

18 Claims, 4 Drawing Sheets

METHOD AND APPARATUS FOR MANUFACTURING MONOLITHIC CERAMIC ELECTRONIC COMPONENT

BACKGROUND OF THE INVENTION

1. Field of the Invention

The present invention generally relates to a method for manufacturing a monolithic ceramic electronic component such as a monolithic capacitor, and to a ceramic green sheet laminating apparatus used for the same manufacturing method. More particularly, the present invention relates to a method for manufacturing a monolithic ceramic electronic component and a ceramic green sheet laminating apparatus that allow a laminate to be obtained by using a long ceramic green sheet and card-like ceramic green sheets.

2. Description of the Related Art

Hitherto, when manufacturing a monolithic ceramic electronic component, firstly inner electrodes have been formed on one main surface of a ceramic green sheet. Then, a plurality of these ceramic green sheets has been laminated to obtain a laminate. The laminate has been fired after cutting, and a ceramic sintered body has been obtained. Outer electrodes have been formed on the outer surface of the ceramic sintered body, and thereby a monolithic ceramic electronic component has been achieved.

The above-described plurality of the ceramic green sheets must be laminated with a high degree of accuracy. Accordingly, methods for laminating ceramic green sheets using a cutting/laminating head have hitherto been proposed.

For example, Japanese Unexamined Patent Application Publication No. 4-2196 discloses a method for cutting a ceramic green sheet and laminating the cut ceramic green sheets using a cutting/laminating head, after delivering a long ceramic green sheet from a roll and forming inner electrodes on the top surface of the ceramic green sheet.

On the other hand, Japanese Unexamined Patent Application Publication No. 6-246730 discloses a method for stacking, one after another, card-like ceramic green sheets that have been cut into a predetermined shape in advance. Specifically, ceramic green sheets which are punched into a specified shape are stored together with a carrier film in a magazine with the cut carrier films facing upward. These ceramic green sheets with the carrier films are moved onto a laminating stage while each of the sheets is held on an adhesion head. The ceramic green sheets are then laminated on the laminating stage.

As disclosed in Japanese Unexamined Patent Application Publication No. 4-2196, in a laminating method using a long ceramic green sheet, cutting and laminating processes are performed after inner electrodes have been formed on the conveyed ceramic green sheet. When a plurality of types of ceramic green sheets are to be laminated, the laminating process becomes very complicated.

For example, when attempting to laminate a plurality of types of ceramic green sheets in which the shape of inner electrodes are different from each other, a device for printing inner electrodes needs to be changed. Alternatively, it is necessary to previously prepare rolls of ceramic green sheets on which mutually different inner electrodes have been formed, to deliver ceramic green sheets from a plurality of rolls, and to thereby perform cutting and laminating operations thereon.

Furthermore, when a plurality of ceramic green sheet rolls are to be prepared, both the number of rolls and the number of conveying equipment increase. This necessitates a large space for laminating ceramic green sheets.

On the other hand, in the method set forth in Japanese Unexamined Patent Application Publication No. 6-246730, since it is essential only that a plurality of types of ceramic green sheets be stored in the magazine in advance, a plurality of types of ceramic green sheets can be laminated within reason. However, in this method, it is necessary to convey ceramic green sheets one after another from the magazine and stack them, thereby making it difficult to realize a high-speed laminating process.

SUMMARY OF THE INVENTION

Accordingly, it is an object of the present invention to provide a method for manufacturing a monolithic ceramic electronic component and a ceramic green sheet laminating apparatus that allow a plurality of types of ceramic green sheets to be efficiently laminated, and that enables high-speed of laminating process and a reduction in space for lamination.

In order to achieve the above-described object, the present invention, in a first aspect, provides a method for manufacturing a monolithic ceramic electronic component formed by using a laminate in which a plural types of ceramic green sheets are laminated. This method comprises the step of preparing a delivery roll around which a long first ceramic green sheet supported on a first carrier film is wound, and a card-like second ceramic green sheet; a first laminating step wherein the first ceramic green sheet supported on the first carrier film is delivered from the delivery roll, wherein the first ceramic green sheet is cut by a cutting/laminating head into a predetermined size, and wherein the cut first ceramic green sheet is laminated to the cutting/laminating head; a second laminating step wherein the card-like second ceramic green sheet is cut by the cutting/laminating head into a predetermined size, and wherein the cut second ceramic green sheet is laminated to the cutting/laminating head; the step of forming a laminate by performing each of the first and second steps plural times; and the step of obtaining a sintered body by firing the laminate.

In the first aspect of the present invention, preferably, inner electrodes are formed on the first ceramic green sheet and/or the second ceramic green sheet.

Also, in the first aspect of the present invention, it is preferable that a plurality of types of the card-like second ceramic green sheets be prepared, and that a plurality of types of the second ceramic green sheets be laminated.

The present invention, in a second aspect, provides a ceramic green sheet laminating apparatus used for the above-described method for laminating ceramic green sheets. This apparatus comprises a delivery roll around which a long first ceramic green sheet, which is supported on a first carrier film, is wound; a take-up roll that is disposed at a predetermined distance from the delivery roll, and that takes up the first carrier film delivered from the delivery roll; first conveying member that conveys the first carrier film and the first ceramic green sheet supported thereon, from the delivery roll to the take-up roll; card-like sheet conveying unit on which a card-like second ceramic green sheet is placed; a cutting/laminating head that is disposed between the delivery roll and the take-up roll, that cuts the first and second ceramic green sheets, and that laminates the cut first and second ceramic green sheets to the bottom surface thereof; a head driving source that moves the cutting/laminating head upward and downward, between the position of the cutting/laminating head when it is located above the first or second ceramic green sheet and the position of the cutting/laminating head when it cuts the first or second ceramic green sheet; a second conveying member that moves the card-like sheet conveying unit, between a first position adjacent a position beneath the cutting/laminating head during cutting and laminating operations thereof, and a second position beneath the cutting/laminating head during cutting and laminating operations thereof.

The ceramic green sheet laminating apparatus according to the second aspect of the present invention, preferably, further comprises a sheet lowering member that positions the first carrier film and first ceramic green sheet beneath the card-like sheet conveying unit when the card-like sheet conveying unit is located at the second position.

Also, the ceramic green sheet laminating apparatus according to the second aspect of the present invention, preferably, further comprises a plurality of the card-like sheet conveying units and a plurality of the second conveying member in order to cut and laminate the plurality of types of the second ceramic green sheets.

Moreover, the ceramic green sheet laminating apparatus according to the second aspect of the present invention, preferably, further comprises a sheet rack that stores a plurality of the card-like second ceramic green sheets, and that supplies the ceramic green sheets stored therein to the conveying unit.

The above and other objects, features, and advantages of the present invention will be clear from the following detailed description of the preferred embodiments of the invention in conjunction with the accompanying drawings.

DESCRIPTION OF THE PREFERRED EMBODIMENTS

Figure 1:
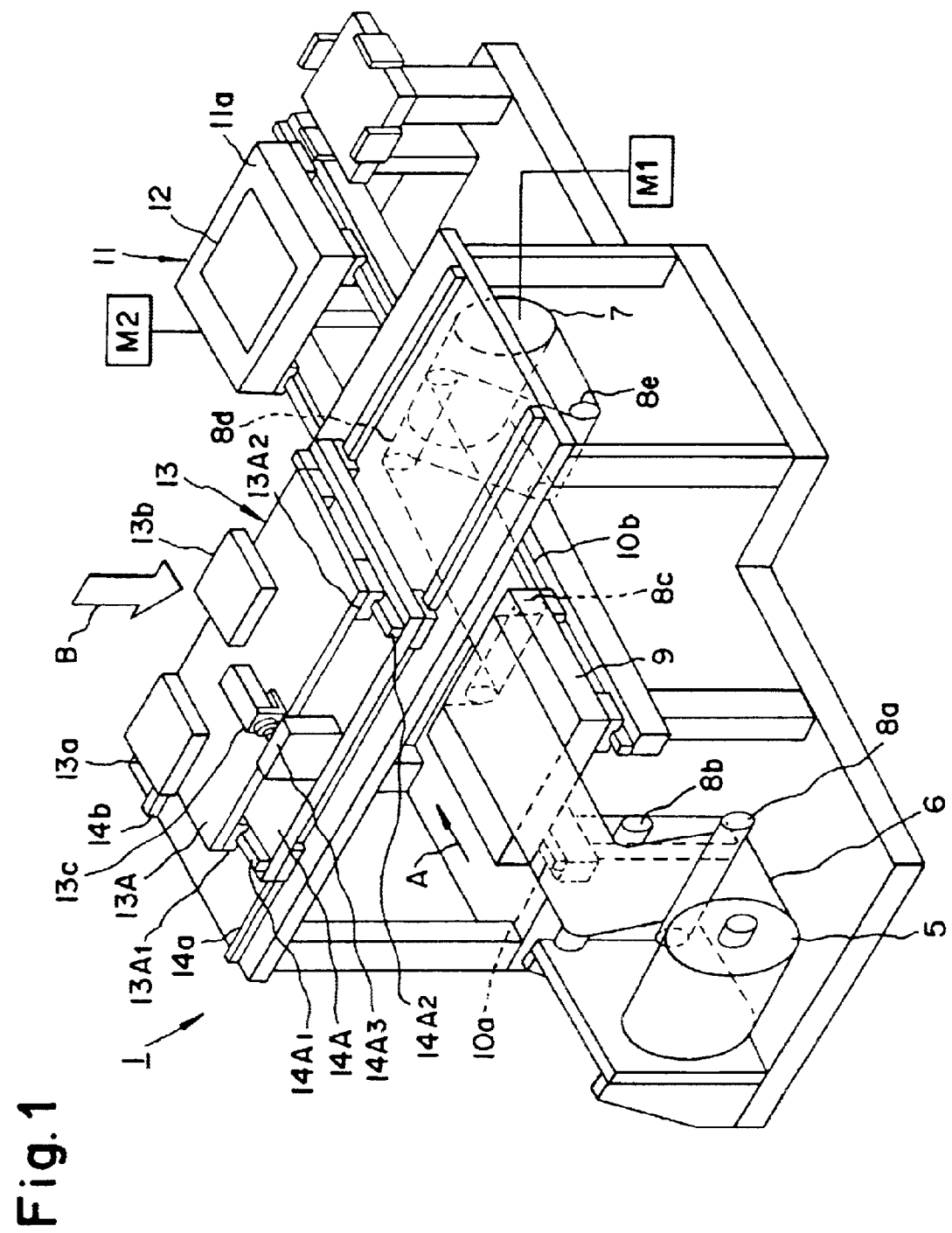
FIG. 1 is a perspective view showing the outline of a ceramic green sheet laminating apparatus according to an embodiment of the present invention.
Figure 2:
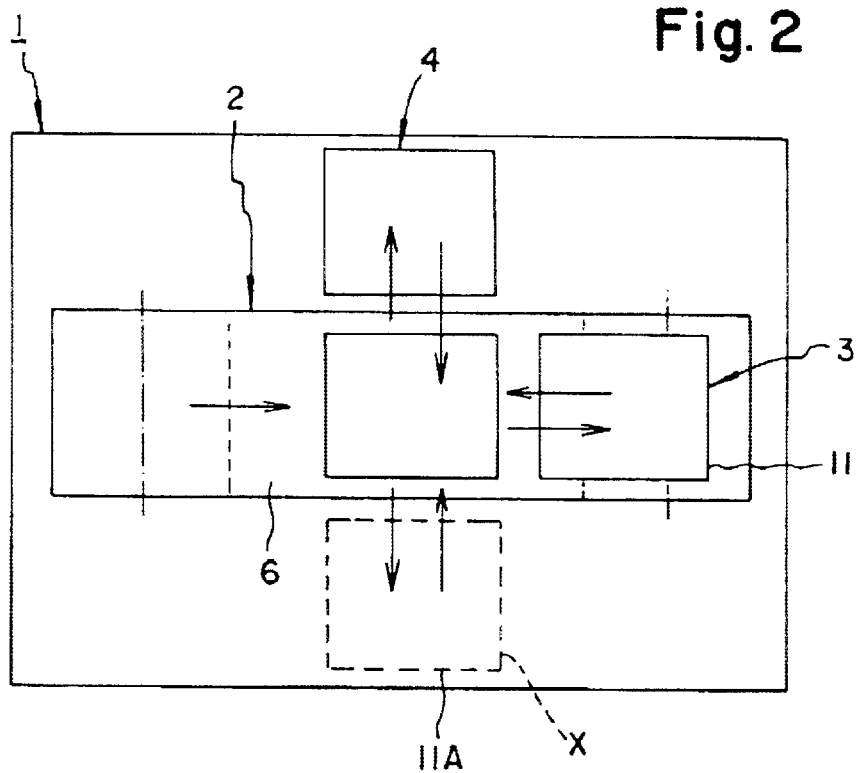
FIG. 2 is a schematic plan view explaining the ceramic green sheet laminating apparatus according to the embodiment of the present invention.
Figure 4:
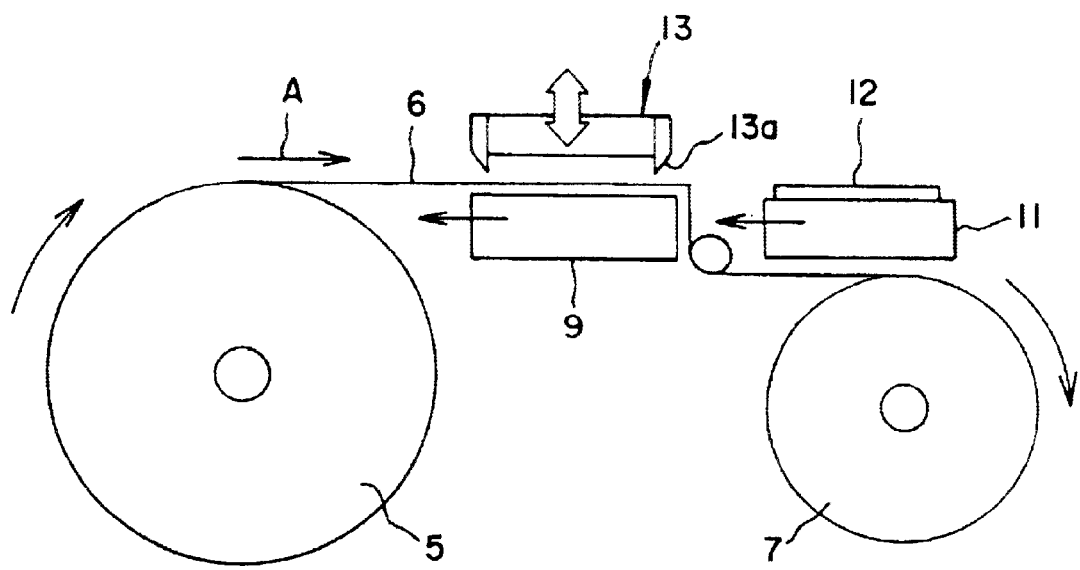
FIG. 4 is a schematic side view showing the configuration of the ceramic green sheet laminating apparatus according to the embodiment of the present invention.

FIG. 1 is a perspective view showing the outline of a ceramic green sheet laminating apparatus according to an embodiment of the present invention; FIG. 2 is a schematic plan view thereof; and FIG. 4 is a schematic front view thereof.

As schematically illustrated in FIG. 2, the ceramic green sheet laminating apparatus 1 according to this embodiment roughly comprises a long sheet conveying device 2, a card-like sheet conveying device 3, and cutting/laminating head 4. A long ceramic green sheet, having inner electrodes formed on the top surface thereof, is supplied from the sheet conveying device 2. The long ceramic green sheet is punched into a specified shape by the cutting/laminating head 4 that has been moved to a position above this long ceramic green sheet. The punched ceramic green sheet is laminated to the bottom surface of the cutting/laminating head 4.

On the other hand, a card-like ceramic green sheet 3, which is different from the long ceramic green sheet, is supplied and moved to a position below the cutting/laminating head 4 by the card-like sheet conveying device 3, and is punched into a specified shape by the cutting/laminating head 4. The punched card-like ceramic green sheet is laminated to the bottom surface of the cutting/laminating head 4.

Therefore, the combined use of a plurality of types of the above-described ceramic green sheet conveying devices 2 and 3 would enable a plurality of types of ceramic green sheets to be efficiently laminated.

Detailed descriptions will now be made of the ceramic green sheet laminating apparatus 1 according to this embodiment, with reference to FIGS. 1, 3, and 4.

Referring to FIG. 1, in the ceramic green sheet laminating apparatus 1, a long first ceramic green sheet 6 supported on a first carrier film (not shown) is wound around a delivery roll 5. In FIG. 1, the carrier film wherein a ceramic green sheet is formed on the top surface thereof, is omitted from its illustration for the sake of simplifying the drawing. A take-up roll 7 is disposed apart from the delivery roll 5.

The first ceramic green sheet 6 with the carrier film is conveyed from the delivery roll 5 toward the take-up roll 7. This conveyance is performed by a motor M1 as a first conveying member connected to the take-up roll 7.

Rotatable rollers 8a to 8e are disposed between the delivery roll 5 and the take-up roll 7. The rollers 8a, 8b, 8d, and 8e are arranged so that their positions are fixed. A support plate 9 is disposed between the rollers 8b and 8c. The support plate 9 is provided so that cutting and laminating operations with respect to the long ceramic sheet 6 are performed on the top surface thereof. Specifically, between the rollers 8b and 8c, the ceramic green sheet 6 with the carrier film is supported on the top surface of the support plate 9 while the ceramic green sheet 6 faces upward.

The support plate 9 is configured so as to be movable together with the roller 8c in the conveying direction of the long ceramic sheet, the conveying direction being indicated by the arrow A in FIG. 1.

A pair of guide rails 10a and 10b extending along the conveying direction A are provided. The support plate 9 can be moved by a driving source (not shown) along the guide rails 10a and 10b. Specifically, the support plate 9 is arranged to be movable between the first position shown in FIG. 1 and a second position which is located beneath a cutting/laminating head 13, which will be described later.

On the other hand, a card-like sheet conveying unit 11 is disposed on an opposite side of the guide rails 10a and 10b opposed to where the support plate 9 is provided, with the cutting/laminating head 13 interposed approximately at the midpoint therebetween. The sheet conveying unit 11 is configured so as to be moved by a reciprocative driving source having a motor M2 as a second conveying member, in the conveying direction A and in a direction opposite to the conveying direction A along the guide rails 10a and 10b.

Specifically, as illustrated in FIG. 1, the card-like sheet conveying unit 11 is arranged to be movable between a first position which is located adjacent the position beneath the cutting/laminating head 13 during cutting and laminating operations thereof a the second position which is located beneath the cutting/laminating head 13 during cutting and laminating operations thereof.

In this embodiment, the card-like sheet conveying unit 11 is disposed in an extension area of the long first ceramic green sheet 6 in the conveying direction thereof, and is arranged to be movable in the conveying direction of the first ceramic green sheet 6 and in the direction opposite to this conveying direction. Alternatively, however, the card-like sheet conveying unit 11 may be arranged to be movable in a direction perpendicular to the conveying direction of the ceramic green sheet 6. The top surface 11a of the card-like sheet conveying unit 11 is flat. On the top surface 11a, there is provided a card-like ceramic green sheet 12 supported on a second carrier film.

The cutting/laminating head 13 is disposed above a longitudinal intermediate position of the guide rails 10a and 10b. In this embodiment, the cutting/laminating head 13 comprises a cutting portion 13a and a lamination portion 13b. Alternatively, however, as disclosed in Japanese Unexamined Patent Application Publication No. 4-2196, a cutting/laminating head wherein a laminating head and a cutting edge are unified, and wherein lamination can be performed following cutting, may be used.

Figure 3:
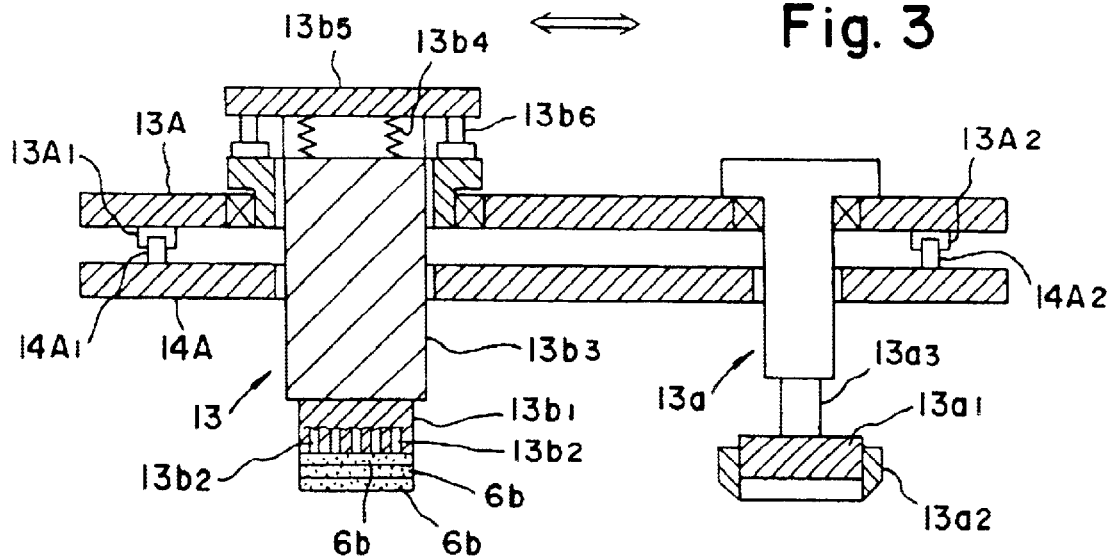
FIG. 3 is a sectional view explaining a cutting/laminating head of the ceramic green sheet laminating apparatus according to the embodiment of the present invention, the sectional view being taken along the conveying direction (A)

FIG. 3 as a front view shows that the cutting/laminating head 13 is provided with the cutting portion 13a and lamination portion 13b as described above. The cutting portion 13a has a cutting head $13a_1$. An annular cutting edge $13a_2$ is disposed around the cutting head $13a_1$. The cutting head $13a_1$ is fixed to a cylinder rod of a cylinder $13a_3$, which is schematically illustrated. The cutting head 13a, with the cutting edge $13a_2$ is moved upward or downward by driving the cylinder $13a_3$.

On the other hand, the lamination portion 13b has a laminating head $13b_1$. As schematically illustrated, the laminating head $13b_1$ has a plurality of suction ports $13b_2$ open to the bottom surface thereof. The ceramic green sheet is adsorbed and held to the laminating head $13b_1$ by suction from the suction ports $13b_2$. The suction ports $13b_2$ are connected to a suction source (not shown).

The laminating head $13b_1$ is fixed to the bottom surface of a press head $13b_3$. The press head $13b_3$ is hung from a movable plate $13b_5$ with a coil spring $13b_4$. The movable plate $13b_5$ is arranged to be movable along the longitudinal direction of a fixing guide $13b_6$, that is, in the vertical direction. A hydraulic press unit (not shown) is connected to the top surface of the movable plate $13b_5$, so that the movable plate $13b_5$ can be moved downward or upward by the hydraulic press unit. As a result, the laminating head $13b_1$ fixed to the bottom surface of the press head $13b_3$ is movable upward or downward. The movement of the laminating head $13b_1$ in the downward direction is performed until the bottom surface thereof has been brought into pressure contact with the ceramic green sheet on the support plate 9.

The cutting portion 13a and the lamination portion 13b are connected to a plate 13A. The plate 13A is connected to a plate 14A disposed therebelow. The plates 13A and 14A are integrally moved in the direction indicated by the arrow at an upper portion in FIG. 31 that is, in a direction perpendicular to the above-described conveying direction A. More specifically, the cutting/laminating head 13 is configured so as to be movable along second guide rails 14a and 14b, which extend in a direction perpendicular to the conveying direction A. That is, the cutting/laminating head 13 is arranged to be movable among a first position during a cutting operation, a second position during a laminating operation, and a third position laterally spaced from the conveying path of the ceramic green sheet 6, as shown in FIG. 2. These movements are performed by a reciprocative driving source (not shown).

As shown in FIGS. 1 and 3, rail $14A_1$ and $14A_2$ extending parallel to the conveying direction A are fixed to the plate 14A. Guides $13A_1$ and $13A_2$, having grooves respectively engaged with the rails $14A_1$ and $14A_2$, are fixed to the bottom surface of the plate 13A. The plate 13A, therefore, is arranged so that the position thereof can be adjusted with respect to the plate 14A along the conveying direction A. This position adjustment of the plate 13A is performed by a motor 13c shown in FIG. 1. The motor 13c is installed on the plate 13A, and is also connected to an engagement portion $14A_3$ provided on the plate 14A. The position of the plate 13A in the conveying direction A is adjusted by rotating the motor 13c in the normal or reverse directions.

Meanwhile, the take-up roll 7 and the roller 8e are positioned below the guide rails 10a and 10b so as not to hinder the above-described support plate 9 and card-like conveying unit 11 from moving.

Next, descriptions will be made of a method for laminating ceramic green sheets using the laminating apparatus 1 according to this embodiment.

First, a ceramic green sheet 6 with the long first carrier film is conveyed from the delivery roll 5 toward the take-up roll 7. In this embodiment, a ceramic green sheet 6 having inner electrodes (not shown) printed thereon is conveyed from the delivery roll 5. Alternatively, however, the arrangement may be such that a ceramic green sheet 6 with inner electrodes not yet printed thereon is conveyed, and that, in the downstream of the roller 8b, inner electrodes are formed on the top surface of the ceramic green sheet 6 by screen printing or the like prior to the cutting/laminating operations, which will be described later.

The ceramic green sheet 6 supported on the carrier film is conveyed in the direction indicated by the arrow A in a manner such that the carrier film is in contact with the top surface of the support plate 9.

Figure 5:
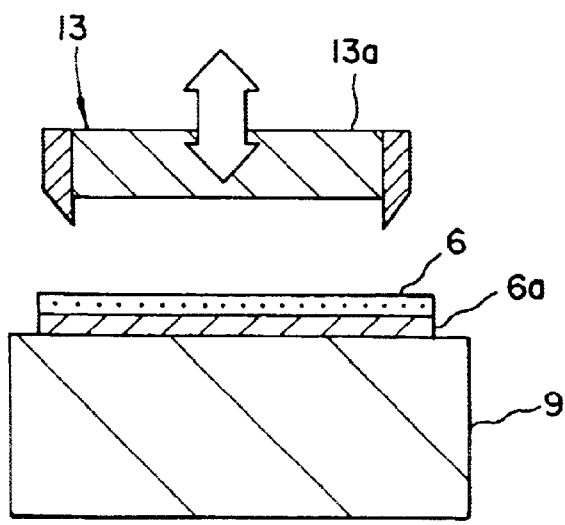
FIG. 5 is a schematic front view explaining the process wherein a card-like ceramic green sheet is cut by a cutting/laminating head in the ceramic green sheet laminating apparatus according to the embodiment of the present invention.

Next, the support plate 9 is moved from the illustrated first position to the second position between the guide rails 14a and 14b, along the conveying direction A. On the other hand, the cutting/laminating head 13 is conveyed from the illustrated third position spaced from the conveying path of the ceramic green sheet to the above-described first position, for a cutting operation, along the guide rails 14a and 14b. Then, after the cutting/laminating head 13 is conveyed to the first position, as shown in FIG. 5, the cutting portion 13a of the cutting/laminating head 13 is lowered, thereby cutting the ceramic green sheet 6 supported on the carrier film 6a, into a predetermined shape.

Thereafter, the cutting/laminating head 13 is moved to the second position for a laminating operation, and the laminating head $13b_1$ shown in FIG. 3 is lowered, and the cut ceramic green sheet 6b is press-bonded to the bottom surface of the laminating head $13b_1$. As a result, only the cut ceramic green sheet 6b is laminated to the bottom surface of the laminating head $13b_1$. FIG. 3 shows a state wherein a plurality of ceramic green sheets 6b have been laminated. Here, the support plate 9 is used for supporting the ceramic green sheet 6, which is supported on the carrier film 6a, during these cutting/laminating operations.

After the above-described lamination of the ceramic green sheet 6 has been completed, the cutting/laminating head 13 is moved to the first position (i.e., cutting position) in preparation for the next cutting.

When ceramic green sheets with a predetermined shape are successively punched from the long ceramic green sheet 6, and the punched green sheets are to be laminated, the above-described cutting/laminating processes are repeated.

On the other hand, when a card-like ceramic green sheet 12 is to be laminated, firstly the support plate 9 is, as schematically illustrated in FIG. 4, moved to the illustrated first position in adjacent the cutting/laminating head 13 the direction opposite to the conveying direction indicated by the arrow A. As a consequence, the support plate 9 moves from a location beneath the cutting/laminating head 13. Due to this movement, the ceramic green sheet 6 returns to the state shown in FIG. 1. That is, the ceramic green sheet 6 is moved to a position which is below the guide rails 10a and 10b, at the position between rollers 8c and 8d.

Next, the card-like sheet conveying unit 11 is moved along the guide rails 10a and 10b, from the illustrated first position adjacent the head 13 to the second position which is beneath the cutting/laminating head 13. In the state wherein the card-like sheet conveying unit 11 is positioned beneath the cutting/laminating head 13, the cutting and lamination of the ceramic green sheet 12 are performed by the cutting/laminating head 13 similar to that described above.

Then, the conveying unit 11 is returned to the first position adjacent the head 13 shown in FIG. 1. When the card-like ceramic green sheets 12 are to be further successively laminated, the above-described cutting/laminating processes with respect to the ceramic green sheets 12 are repeated. In this case, new card-like ceramic green sheets 12 are successively supplied to the conveying unit 11. By varying the types of ceramic green sheets 12, more types of ceramic green sheets can be easily laminated.

Next, instead of using the card-like ceramic green sheet 12, a long ceramic green sheet 6 is to be again cut and the cut ceramic green sheet is to be laminated, the support plate 9 is moved from the state (i.e., the first position adjacent the head 13) shown in FIG. 4, to the second position beneath the head 13 along the conveying direction A, and the above-described cutting and lamination of the ceramic green sheet 6 are performed.

In this manner, a laminate can be achieved using different green sheets. Herein, the lamination configuration of a plurality of types of ceramic green sheets may be appropriately selected depending on an intended monolithic ceramic electronic component. For example, when attempting to obtain a monolithic capacitor, firstly a plain card-like ceramic green sheet is laminated, thereafter a ceramic green sheet having an inner electrode formed thereon is punched from the long ceramic green sheet, then laminated thereon, and a further plain card-like ceramic green sheet 12 is laminated thereon.

When a monolithic LC composite component, a monolithic inductance component, or the like is to be constructed, the outer layer portion thereof is formed using the plain long ceramic green sheet 6, and as the card-like ceramic green sheets 12, the ceramic green sheets 12 having a plurality of types of inner electrode patterns or coil patterns formed thereon, may be laminated.

Therefore, according to this embodiment, since a ceramic green sheet conveying unit supplying a long ceramic green sheet 6, and a card-like sheet conveying unit 11 supplying card-like ceramic green sheets 12 are used in combination, a plurality of types of ceramic green sheets can be efficiently laminated.

In the above-described embodiment, a single card-like sheet conveying unit 11 is used. However, as indicated by the broken line X in FIG. 2, a card-like second sheet conveying unit 11A may also be employed in addition to the card-like sheet conveying unit 11. In this case, more than one type of ceramic green sheets can be laminated. Here, as indicated by the arrow in FIG. 2, the card-like sheet conveying unit 11A is arranged to be movable between a first position which is located adjacent the conveying path of the ceramic green sheet 6 and a second position which is located beneath the cutting/laminating head, in a direction perpendicular to the conveying direction of the long ceramic green sheet 6.

Figure 6:
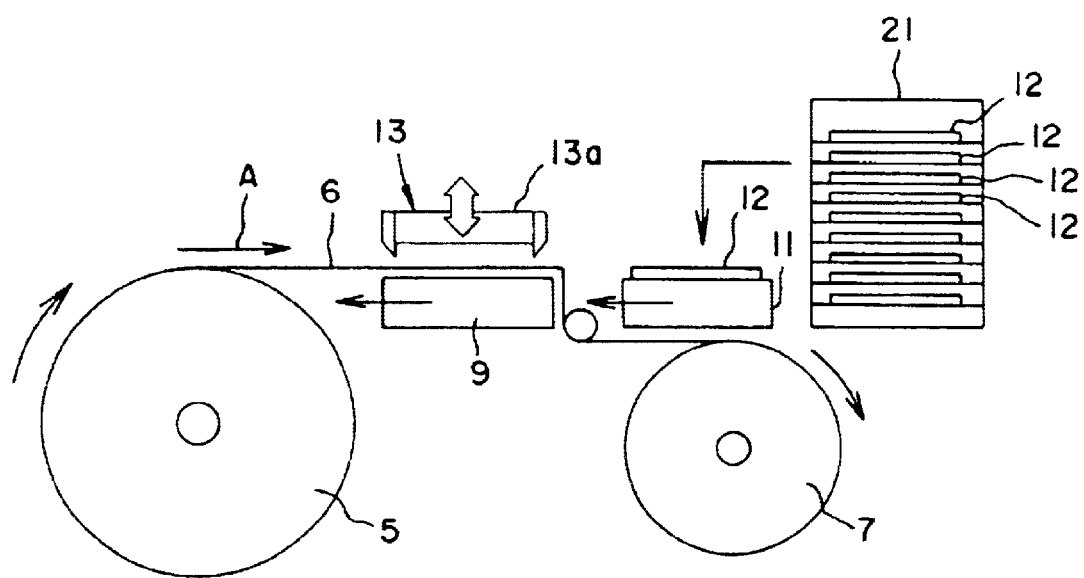
FIG. 6 is a schematic front view showing a modification of the ceramic green sheet laminating apparatus according to the present invention.

The method for supplying card-like ceramic green sheets to the card-like sheet conveying unit 11 for laminating card-like ceramic green sheets 12 is not particularly limited. For example, as schematically illustrated in FIG. 6, a sheet rack 21 wherein a plurality of card-like ceramic green sheets 12 are stored while supported on the carrier film, may be used. In this case, card-like ceramic green sheets 12 can be successively supplied from the sheet rack 21 to the conveying unit with ease. Alternatively, a plurality of different types of card-like ceramic green sheets may be stored in the sheet rack 21. In this case, a plurality of different types of card-like ceramic green sheets 12 can be easily laminated.

The structure of the sheet rack 21 itself is not particularly restricted. It is preferable, however, that the sheet rack have a structure wherein the ceramic green sheets 12 can be easily drawn out laterally from the sheet rack 21 so that the ceramic green sheets 12 supported on the carrier films can be easily supplied from the sheet rack 21 to the conveying unit 11. Alternatively, the supply of the ceramic green sheets 12 from the sheet rack 21 to the conveying unit 11 may be performed by the use of an appropriate ceramic green sheet holding member such as a suction chuck.

As is evident from the foregoing, the method for manufacturing a monolithic ceramic electronic component according to the present invention comprises a first laminating step wherein the long first ceramic green sheet, which is supported on the first carrier film, is delivered from the delivery roll, wherein the first ceramic green sheet is cut by the cutting/laminating head into a predetermined size, and wherein the cut first ceramic green sheet is laminated to the cutting/laminating head; and a second laminating step wherein the card-like second ceramic green sheet is cut by the cutting/laminating head into a predetermined size, and wherein the cut second ceramic green sheet is laminated to the cutting/laminating head. Therefore, in these first and second laminating processes, by using mutually different types of ceramic green sheets, such as ceramic green sheets having mutually different inner electrodes formed thereon, a plurality of types of ceramic green sheets can be efficiently laminated. At the same time, the need for a plurality of rolls and roll conveying devices is eliminated. The present invention, therefore, enables size-reduction and simplification of the apparatus when laminating a plurality of types of ceramic green sheets and allows a reduction in the space necessary for a laminating process, over the conventional method that uses only a single roll around which a long ceramic green sheet is wound and a single roll conveying device.

Furthermore, in the present invention, since roll type conveying devices can be employed, a high-speed laminating process can be implemented, over the conventional method that uses only card-like ceramic green sheets.

As the first and second ceramic green sheets, ceramic green sheets having appropriate inner electrodes formed thereon or plain ceramic green sheets can be used depending on the inner electrode shape of an intended monolithic ceramic electronic component. Specifically, when inner electrodes are formed on the first and/or second ceramic green sheets, the inner electrodes of the monolithic ceramic electronic component are formed on the side of the ceramic green sheet where the inner electrodes are formed.

When a plurality of types of card-like second ceramic green sheets supported on the second carrier film are prepared, and the plurality types of second ceramic green sheets are laminated in the second laminating process, more complicated inner electrode structure can be easily formed by using first ceramic green sheets and the plurality types of second ceramic green sheets.

The apparatus for manufacturing a monolithic ceramic electronic component according to the present invention comprises a delivery roll, a take-up roll, a long ceramic green sheet conveying device having the first conveying member, a card-like ceramic green sheet conveying device having a card-like sheet conveying unit, and a cutting/laminating head. Therefore, by using, in combination, the long ceramic green sheet conveying device and the card-like ceramic green sheet conveying device, a plurality of types of ceramic green sheets can be efficiently laminated according to the method of the present invention, without a significant increase in space.

When the card-like sheet conveying unit is located at a second position beneath the cutting/laminating head, if a sheet lowering member which positions the first carrier film and first ceramic green sheet beneath the card-like sheet conveying unit, is further provided, the second ceramic green sheet can be supplied to a position which is located beneath the cutting/laminating head without being hindered by the long first ceramic green sheet.

When a plurality of card-like sheet conveying units and a plurality of second conveying members are provided in order to perform cutting and lamination of a plurality of types of second ceramic green sheets, more types of ceramic green sheets can be easily laminated.

Also, when a plurality of card-like second ceramic green sheets is stored, and a sheet rack that supplies the second ceramic green sheets to the conveying unit is further provided, the card-like second ceramic green sheets can be efficiently supplied to the conveying unit.

While the present invention has been described with reference to what are at present considered to be the preferred embodiments, it is to be understood that various changes and modifications may be made thereto without departing from the invention in its broader aspects and therefore, it is intended that the appended claims cover all such changes and modifications that fall within the true spirit and scope of the invention.

What is claimed is:

1. A method for manufacturing a monolithic ceramic electronic component formed by using a laminate in which a plural of ceramic green sheets are laminated, the method comprising the steps of:

preparing a long first ceramic green sheet supported on a first carrier film;

preparing card-like second ceramic green sheets;

a first laminating step of cutting a first ceramic green sheet by a cutting/laminating head into a predetermined size, and laminating the cut first ceramic green sheet to the cutting/laminating head;

a second laminating step of cutting the card-like second ceramic green sheet by the cutting/laminating head into the predetermined size, and laminating the cut second ceramic green sheet to the cutting/laminating head;

forming a laminate by performing each of the first and second laminating steps plural times; and obtaining a sintered body by firing the laminate.

2. The method for manufacturing a monolithic ceramic electronic component according to claim 1, further comprising the steps of forming inner electrodes on at least one of the first ceramic green sheet and the second ceramic green sheet.

3. The method for manufacturing a monolithic ceramic electronic component according to claim 1, further comprising the step of preparing a plurality of types of the card-like second ceramic green sheets, and laminating the plurality of types of the second ceramic green sheets.

4. The method for manufacturing a monolithic ceramic electronic component according to claim 2, further comprising the step of preparing a plurality of types of the card-like second ceramic green sheets, and laminating the plurality of types of the second ceramic green sheets.

5. The method for manufacturing a monolithic ceramic electronic component according to claim 1, wherein the step of forming the laminate further comprises the step of performing the first and second laminating steps in any predetermined combination thereof.

6. The method for manufacturing a monolithic ceramic electronic component according to claim 1, further comprising the step of conveying the first ceramic green sheet and the card-like second ceramic green sheet to the cutting/laminating head from opposite directions from one another.

7. The method for manufacturing a monolithic ceramic electronic component according to claim 3, further comprising the step of conveying the plurality of types of card-like second ceramic green sheets to the cutting/laminating head from perpendicular directions to one another.

8. The method for manufacturing a monolithic ceramic electronic component according to claim 1, further comprising the step of conveying the first ceramic green sheet and the card-like second ceramic green sheet to the cutting/laminating head from perpendicular directions to one another.

9. The method for manufacturing a monolithic ceramic electronic component according to claim 1, further comprising the step of forming inner electrodes on the first ceramic green sheet prior to the first laminating step.

10. A ceramic green sheet laminating apparatus, comprising:

a delivery roll around which a long first ceramic green sheet, which is supported on a first carrier film, is wound;

a take-up roll is disposed at a predetermined distance from the delivery roll, and takes up the first carrier film delivered from the delivery roll;

first conveying member conveys the first carrier film and the first ceramic green sheet, which is supported thereon, from the delivery roll to the take-up roll;

a card-like sheet conveying unit on which a card-like second ceramic green sheet is placed;

a cutting/laminating head disposed between the delivery roll and the take-up roll, cuts the first and second ceramic green sheets, and laminates the cut first and second ceramic green sheets to a bottom surface thereof;

a head driving source moves the cutting/laminating head upward and downward, between a position of the cutting/laminating head when located above the first or second ceramic green sheet and a position of the cutting/laminating head when cutting the first or second ceramic green sheet; and a second conveying member moves the card-like sheet conveying unit, between a) a first position which is adjacent the cutting/laminating head, and b) a second position which is beneath the cutting/laminating head.

11. The ceramic green sheet laminating apparatus according to claim 10, further comprising a sheet lowering member that positions the first carrier film and the first ceramic green sheet beneath the card-like sheet conveying unit when the card-like sheet conveying unit is located at the second position.

12. The ceramic green sheet laminating apparatus according to claim 10, further comprising a plurality of the card-like sheet conveying units and a plurality of the second conveying member in order to cut and laminate the plurality of types of the second ceramic green sheets.

13. The ceramic green sheet laminating apparatus according to claim 11, further comprising a plurality of the card-like sheet conveying units and a plurality of the second conveying member in order to cut and laminate the plurality of types of the second ceramic green sheets.

14. The ceramic green sheet laminating apparatus according to claims 10, further comprising a sheet rack that stores a plurality of the card-like second ceramic green sheets, and that supplies the ceramic green sheets stored therein to the conveying unit.

15. The ceramic green sheet laminating apparatus according to claim 10, wherein the first and second conveying members include means for conveying the first and second green sheets to the cutting/laminating head in opposite directions to one another.

16. The ceramic green sheet laminating apparatus according to claim 10, wherein the first and second conveying members include means for conveying the first and second green sheets to the cutting/laminating head in a perpendicular direction to one another.

17. The ceramic green sheet laminating apparatus according to claim 10, wherein the first conveying member includes means for forming inner electrodes on the first ceramic green sheet.

18. The ceramic green sheet laminating apparatus according to claim 10, wherein cutting/laminating head cuts and laminates the first and second ceramic green sheets in any predetermined combination thereof.

* * * * *